United States Patent
Choi

(10) Patent No.: US 11,990,191 B2
(45) Date of Patent: May 21, 2024

(54) APPARATUS AND METHOD FOR PROGRAMMING DATA IN A NON-VOLATILE MEMORY DEVICE

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 207 days.

(21) Appl. No.: 17/673,308

(22) Filed: Feb. 16, 2022

(65) Prior Publication Data
US 2023/0104044 A1    Apr. 6, 2023

(30) Foreign Application Priority Data
Oct. 5, 2021    (KR) ........................ 10-2021-0131551

(51) Int. Cl.
| | | |
|---|---|---|
| G11C 16/10 | (2006.01) | |
| G11C 7/10 | (2006.01) | |
| G11C 11/56 | (2006.01) | |
| G11C 16/04 | (2006.01) | |
| G11C 16/26 | (2006.01) | |
| G11C 16/34 | (2006.01) | |

(52) U.S. Cl.
CPC ........ *G11C 16/3459* (2013.01); *G11C 7/1039* (2013.01); *G11C 11/5628* (2013.01); *G11C 16/0483* (2013.01); *G11C 16/10* (2013.01); *G11C 16/102* (2013.01); *G11C 16/26* (2013.01); *G11C 16/3404* (2013.01); *G11C 2211/5621* (2013.01); *G11C 2211/5622* (2013.01)

(58) Field of Classification Search
CPC . G11C 16/3459; G11C 7/1039; G11C 16/102; G11C 16/26; G11C 16/3404; G11C 16/0483; G11C 16/10; G11C 11/5628; G11C 2211/5621; G11C 16/3445; G11C 2211/5622

See application file for complete search history.

(56) References Cited

U.S. PATENT DOCUMENTS

| | | | | |
|---|---|---|---|---|
| 9,230,663 B1* | 1/2016 | Lu | ...................... | G11C 11/5671 |
| 2012/0099375 A1* | 4/2012 | Choi | .................. | G11C 16/0483 |
| | | | | 365/185.11 |
| 2016/0064084 A1* | 3/2016 | Lu | ...................... | G11C 11/5671 |
| | | | | 365/185.22 |

FOREIGN PATENT DOCUMENTS

| KR | 10-2012-0005830 A | 1/2012 |
|---|---|---|
| KR | 10-1134240 B1 | 4/2012 |

* cited by examiner

*Primary Examiner* — Jay W. Radke
(74) *Attorney, Agent, or Firm* — IP & T GROUP LLP

(57) ABSTRACT

A memory device includes a cell group and a control circuit. The cell group includes plural non-volatile memory cells, each capable of storing multi-bit data corresponding to plural program states and an erased state. The control circuit performs at least two partial program operations for programming the multi-bit data in at least two non-volatile memory cells. The at least two partial program operations include an ISPP operation to increase a threshold voltage of the at least two non-volatile memory cells from the erased state to a first program state among the plural program states and a single pulse program operation to increase a threshold voltage of at least one non-volatile memory cell among the at least two non-volatile memory cells from the first program state to another program state which is higher than the first program state among the plural program states.

20 Claims, 10 Drawing Sheets

APPARATUS AND METHOD FOR PROGRAMMING DATA IN A NON-VOLATILE MEMORY DEVICE

CROSS-REFERENCE TO RELATED APPLICATIONS

This patent application claims the benefit of Korean Patent Application No. 10-2021-0131551, filed on Oct. 5, 2021, the entire disclosure of which is incorporated herein by reference.

TECHNICAL FIELD

One or more embodiments of the present disclosure described herein relate to a memory device, and more particularly, to an apparatus and method for programming data in a non-volatile memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

DETAILED DESCRIPTION

Figure 1:
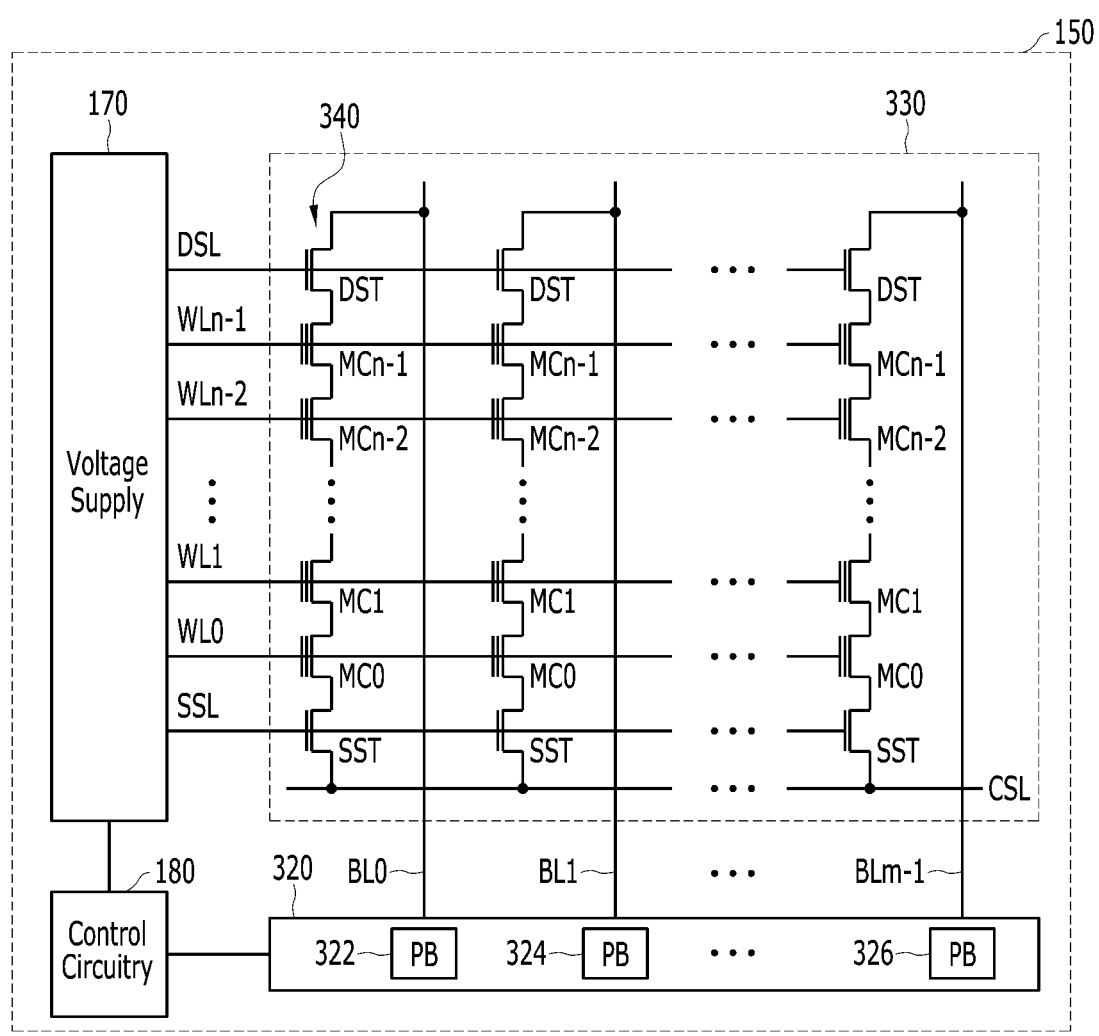
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments described herein provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure may provide an apparatus and method capable of improving a data input/output speed of a memory device.

In addition, an embodiment of the present disclosure can apply a single program pulse to program data in a memory device to increase a threshold voltage from a specific program state to another program state and use a current sensing circuit (CSC) to check a threshold voltage distribution of non-volatile memory cells included in the memory device. Accordingly, a number and a time of performing a verification operation to verify a program state can be reduced.

Specifically, in the memory device according to an embodiment of the present disclosure, a program operation can include plural unit operations. First, the memory device can perform an incremental step pulse programming (ISPP) operation to increase a threshold voltage of a non-volatile memory cell capable of storing multi-bit data from an erase state to a first program state having the lowest threshold voltage among a plurality of program states. Herein, the incremental step pulse programming (ISPP) operation can include applying the program pulse repeatedly to induce gradual increment of the threshold voltage. The memory device can determine the program pulse corresponding to a difference between threshold voltages corresponding to the plurality of program states, and then apply a single program pulse to a non-volatile memory cell. By applying the single program pulse, the non-volatile memory cell can have a threshold voltage suddenly reaching another program state having a higher threshold voltage level than the first program state. Through this procedure, the memory device can reduce the number of verification operations during the program operation, thereby reducing internal current consumption (ICC) occurring during the verification operations.

In an embodiment, a memory device can include a cell array comprising non-volatile memory cells, each non-volatile memory cell capable of storing multi-bit data corresponding to plural program states and an erased state; and a control circuit configured to perform at least two partial program operations for programming the multi-bit data to at least two non-volatile memory cells, the at least two partial program operations including an Incremental Step Pulse Programming (ISPP) operation to increase a threshold voltage of the at least two non-volatile memory cells from the erased state to a first program state among the plural program states and a single pulse program operation to increase a threshold voltage of at least one non-volatile memory cell among the at least two non-volatile memory cells from the first program state to another program state which is higher than the first program state among the plural program states.

The control circuit can be configured to apply program pulses to the at least two non-volatile memory cells for the ISPP operation to gradually increase the threshold voltages from the erased state to the first program state which is the lowest threshold voltage level among the plurality of program states corresponding to the multi-bit data, perform a first verification operation for determining whether the threshold voltages of the at least two non-volatile memory cells have a threshold voltage corresponding to the first program state, apply a single first program pulse to a first non-volatile memory cell among the at least two non-volatile memory cells based on a result of the first verification operation to increase a threshold voltage of the first non-volatile memory cell to a second program state which is higher than the first program state, the first program pulse corresponding to a difference between the first program state and the second program state, and apply a single second program pulse to a second non-volatile memory cell among the at least two non-volatile memory cells based on a result of the first verification operation to increase a threshold voltage of the second non-volatile memory cell to a third program state which is higher than the second program state, the second program pulse corresponding to a difference between the first program state and the third program state.

The at least two non-volatile memory cells can include non-volatile memory cells to be programmed to have threshold voltages corresponding to the first program state, the second program state, and the third program state. The result of the first verification operation can be determined based on whether a ratio of non-volatile memory cells having a threshold voltage corresponding to the first program state among the at least two non-volatile memory cells is equal to or greater than a reference.

The control circuit can be further configured to perform a second verification operation for determining whether the at least two non-volatile memory cells have threshold voltages corresponding to the second program state and the third program state, respectively, after applying the first program pulse and the second program pulse, respectively.

The control circuit can be further configured to apply program pulses to the first non-volatile memory cell to gradually increase the threshold voltage of the first non-volatile memory cell, after determining that the threshold voltage of the first non-volatile memory cell fails to have a threshold voltage corresponding to the second program state based on a result of the second verification operation.

The control circuit can be configured to apply program pulses to the second non-volatile memory cell to gradually increase the threshold voltage of the second non-volatile memory cell, after determining that the threshold voltage of the second non-volatile memory cell fails to have a threshold voltage corresponding to the third program state based on a result of the second verification operation.

The second verification operation can include a verification operation for determining whether the at least two non-volatile memory cells have a threshold voltage corresponding to the first program state. The control circuit can be further configured to apply program pulses to some of the at least two non-volatile memory cells to gradually increase the threshold voltages to the first program state when determining that the some of the at least two non-volatile memory cells fail to have a threshold voltage corresponding to the first program state as a result of the verification operation.

The memory device can further include a page buffer configured to temporarily store the multi-bit data from one of the plural non-volatile memory cells. The page buffer can include plural latches. A number of the plural latches can be equal to or greater than a bit number of the multi-bit data. The memory device can further include a verification circuit coupled to the page buffer and configured to verify whether the multi-bit data is stored in each of the plural non-volatile memory cells.

The verification circuit can include plural current sensing circuits configured to perform a verification operation for the first program state, the second program state, and the third program state to output either a pass signal or a failure signal regarding each of the first program state, the second program state, and the third program state; and a first component configured to output program success when the plural current sensing circuits output the pass signal.

In another embodiment, a method for operating a memory device can include receiving multi-bit data to be programmed in plural non-volatile memory cells; applying program pulses to at least two non-volatile memory cells in an erased state among the plural non-volatile memory cells to gradually increase threshold voltages of the at least two non-volatile memory cells from the erased state to a first program state which is the lowest program state among a plurality of program states corresponding to the multi-bit data; performing a first verification operation for determining whether the at least two non-volatile memory cells have a threshold voltage corresponding to the first program state; applying a single first program pulse to a first non-volatile memory cell among the at least two non-volatile memory cells based on a result of the first verification operation to increase a threshold voltage of the first non-volatile memory cell to a second program state which is higher than the first program state, the first program pulse corresponding to a difference between the first program state and the second program state; and applying a single second program pulse to a second non-volatile memory cell among the at least two non-volatile memory cells based on a result of the first verification operation to increase a threshold voltage of the second non-volatile memory cell to a third program state which is higher than the second program state, the second program pulse corresponding to a difference between the first program state and the third program state.

The at least two non-volatile memory cells can include non-volatile memory cells to be programmed to have threshold voltages corresponding to the first program state, the second program state, and the third program state. The result of the first verification operation can be determined based on whether a ratio of non-volatile memory cells having a threshold voltage corresponding to the first program state among the at least two non-volatile memory cells is equal to or greater than a reference.

The method can further include performing a second verification operation for the second program state and the third program state after applying the first program pulse and the second program pulse.

The method can further include applying program pulses to the first non-volatile memory cell to gradually increase the threshold voltage of the first non-volatile memory cell, when determining that the first non-volatile memory cell fails to have a threshold voltage corresponding to the second program state based on a result of the second verification operation.

The method can further include applying program pulses to the second non-volatile memory cell to gradually increase the threshold voltage of the second non-volatile memory cell, when determining that the second non-volatile memory cell fails to have a threshold voltage corresponding to the third program state based on a result of the second verification operation.

The method can further include performing a verification operation for the first program state during the second verification operation; and applying program pulses to some of the at least two non-volatile memory cells to gradually increase the threshold voltages of the some of the at least two non-volatile memory cells to the first program state when determining that the some of the at least two non-volatile memory cells fail to have a threshold voltage corresponding to the first program state as a result of the verification operation during the second verification operation.

In another embodiment, a memory system can include a controller configured to receive data from an external device, determine a location in which the data is to be stored, and generate multi-bit data to be stored in the location; and a memory device configured to receive the multi-bit data according to the location from the controller, apply program pulses to at least two non-volatile memory cells in an erased state among plural non-volatile memory cells of at least two non-volatile memory cells to gradually increase the threshold voltages from the erased state to a first program state which is the lowest program state among the plurality of program states corresponding to the multi-bit data, perform a first verification operation for determining whether the at least non-volatile memory cells have a threshold voltage corresponding to the first program state, apply a single first program pulse to a first non-volatile memory cell among the at least two non-volatile memory cells based on a result of the first verification operation to increase a threshold voltage of the first non-volatile memory cell to a second program state which is higher than the first program state, the first program pulse corresponding to a difference between the first program state and the second program state, and apply a single second program pulse to a second non-volatile memory cell among the at least two non-volatile memory cells based on a result of the first verification operation to increase a threshold voltage of the second non-volatile memory cell to a third program state which is higher than the second program state, the second program pulse corresponding to a difference between the first program state and the third program state.

The memory device can be further configured to transmit a completion signal to the controller when a program operation regarding the multi-bit data is completed.

The at least two non-volatile memory cells can include non-volatile memory cells to be programmed to have threshold voltages corresponding to the first program state, the second program state, and the third program state. The result of the first verification operation can be determined based on whether a ratio of non-volatile memory cells having a threshold voltage corresponding to the first program state among the at least two non-volatile memory cells is equal to or greater than a reference.

The memory device can be further configured to perform a second verification operation for the second program state and the third program state after applying the first program pulse and the second program pulse.

The memory device can be further configured to: apply program pulses to the first non-volatile memory cell to gradually increase the threshold voltage of the first non-volatile memory cell, when determining that the first non-volatile memory cell fails to have a threshold voltage corresponding to the second program state based on a result of the second verification operation; and apply program pulses to the second non-volatile memory cell to gradually increase the threshold voltage of the second non-volatile memory cell, when determining that the second non-volatile memory cell fails to have a threshold voltage corresponding to the third program state based on the result of the second verification operation.

In another embodiment, an operating method of a memory device can include: performing first program loops on memory cells coupled to a word line; and sequentially performing second and third program loops on the memory cells when a number of on-cells among memory cells according to a reference verification voltage is greater than a reference number as a result of the first program loops. Each of the first program loops can include: applying a first program pulse to the word line, and verifying whether the number of on-cells is greater than the reference number, wherein the first program pulse increases by a default amount as the first program loops proceed according to an incremental step pulse programming (ISPP) scheme. The second program loop can include: sequentially applying a predetermined number of second program pulses to the word line, and sequentially verifying, after the sequentially applying of the second program pulses, whether the memory cells have respective target programmed statuses, wherein levels of the second program pulses are different from each other by predetermined amounts with reference to the first program pulse of a last one of the first program loops. The third program loop can include: sequentially applying a predetermined number of third program pulses to the word line, and sequentially verifying, after the sequentially applying the third program pulses, whether the memory cells have the respective target programmed statuses, and wherein levels of the third program pulses are different from each other by the default amount with reference to the first program pulse of the last one of the first program loops.

Embodiments will now be described with reference to the accompanying drawings, wherein like numbers reference like elements.

FIG. 1 illustrates a memory device 150 that includes a memory cell array circuit formed in a memory die according to an embodiment of the present disclosure.

Referring to FIG. 1, the memory device 150 may include at least one memory group 330 having a plurality of cell strings 340. Each cell string 340 may include a plurality of non-volatile memory cells MC0 to MCn−1 connected to a respective bit line of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn−1 of each cell string 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding bit lines of the bit lines BL0 to BLm−1.

In an embodiment, the memory group 330 may include NAND-type flash memory cells MC0 to MCn−1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

Figure 2:
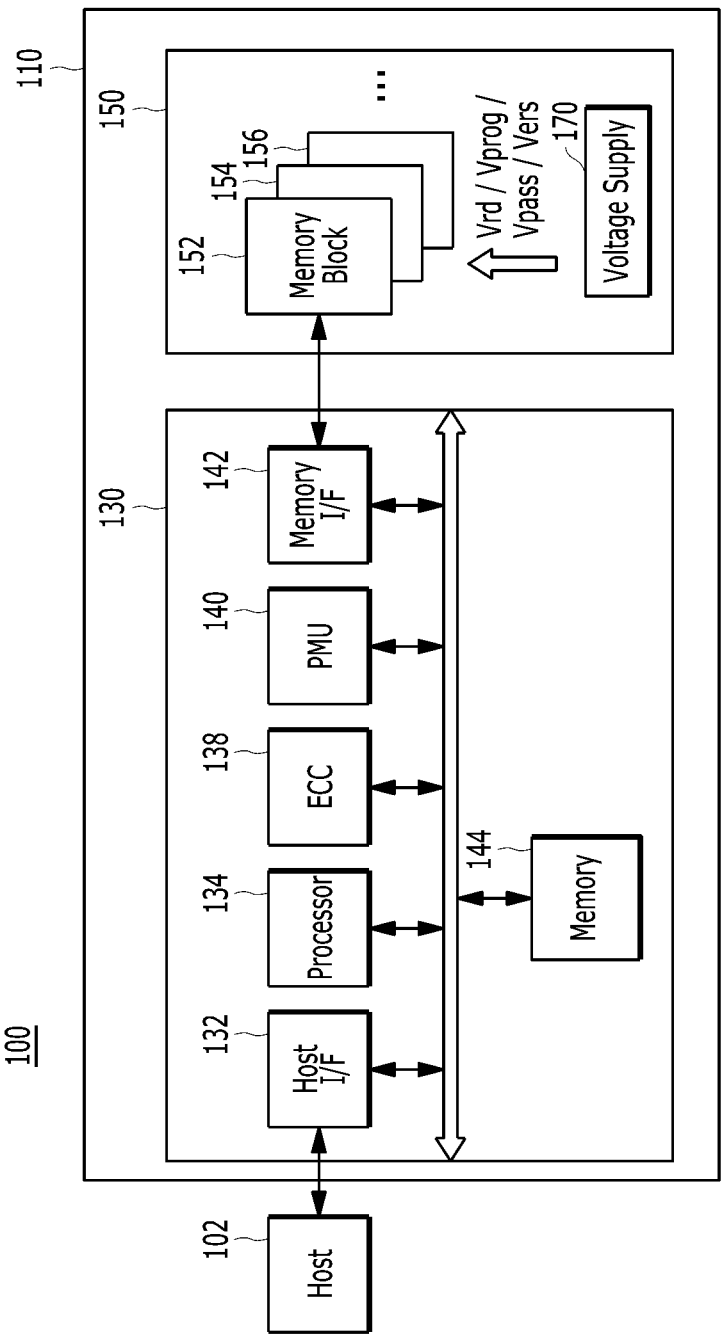
FIG. 2 illustrates a data processing system according to an embodiment of the present disclosure.

FIG. 2 shows a memory system 110 which may include the memory device 150 according to an embodiment of the present disclosure. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure, for example, a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, a plurality of drain select lines DSL, a plurality of word lines WL, a plurality of dummy word lines DWL, and a plurality of common source lines CSL. In one embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIGS. 1 and 2, the memory device 150 may include a voltage supply circuit 170 which can supply a word line voltage, e.g., one or more predetermined voltages such as a program voltage, a read voltage, and a pass voltage, for respective word lines of the word lines according to an operation mode, or may supply a voltage to a bulk, e.g., a well region, in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other.

In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 4 to 8) for generating target voltages having various levels.

In an embodiment, the voltage supply circuit 170 may be coupled to a first pin or pad receiving a first power voltage VCC applied from the outside, e.g., an external device, and a second pin or pad receiving the second power voltage VPP applied from the external device. The second power voltage VPP may have a greater voltage level, e.g., twice or more higher than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326.

The page buffers 322, 324, 326 may be coupled to a data input/output device, e.g., a serialization circuit or a serializer, through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information, e.g., a physical address, regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution, corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment, it is possible to provide an apparatus and method which is capable of reducing a time for discharging a bit line or a channel between program pulse applications during a data programming operation accomplished by applying a plurality of program pulses to memory cells in a memory device. When a discharge time could be reduced, the speed of the program operation of the memory device may be increased. For example, in order to discharge a bit line or a channel in the memory device, the memory device can control or adjust the voltage level of a bit line select line or a drain select line (DSL), in order to avoid that a transistor is in a floating state when controlled through the bit line select line or the drain select line (DSL). Because the transistor might be in the floating state, the bit line or channel could not be discharged appropriately.

In an embodiment, a memory device can adjust and change a setup time for adjusting a potential of a bit line after applying a program pulse during a unit programming operation in which a program pulse to memory cell is applied to a non-volatile memory cell in the memory device. As a result, it is possible to provide an apparatus and method that is capable of increasing the speed of the program operation and/or improving program operation efficiency.

For example, during an operation of applying a plurality of program pulses to non-volatile memory cells in the memory device in order to program the non-volatile memory cells with multi-bit data, the memory device can perform a unit program operation in which a second program pulse is applied after a first program pulse has been applied, in one of various modes.

The modes of the unit program operation can include a first program mode, a second program mode, and a third program mode. In the first program mode, the degree to which data is programmed in response to the second program pulse, e.g., a change or a shift of threshold voltage in a non-volatile memory cell when the second program pulse is applied, may be similar to or greater than the degree to which data is programmed in response to the first program pulse. In the second program mode, the degree to which data is programmed in response to the second program pulse is smaller than the degree to which data is programmed in response to the first program pulse. In the third program mode, the degree to which data is programmed in response to the second program pulse is non-existent, e.g., there is no change or no shift of the threshold voltage in the non-volatile memory cell even when the second program pulse is applied. The mode could be achieved based on a potential of the bit line coupled to a target memory cell when a program pulse is applied. If the discharge time could be reduced, the memory device can improve the efficiency or speed of the data program operation by adjusting and changing the setup time used to change or discharge the potential of the bit line.

According to an embodiment, the memory device can change or adjust a control voltage applied through the bit line select line or the drain select line (DSL) in response to a program operation environment, e.g., temperature and a level or a size, or a number of applications regarding a program pulse applied to non-volatile memory cells during the data program operation. Accordingly, the memory device may reduce an operation margin corresponding to each program pulse during the data programming operation by applying a plurality of program pulses to a non-volatile memory cell. This may reduce the time spent on performing the data programming operation.

Referring again to FIG. 2, the memory device 150 is shown as included in a data processing system 100. According to an embodiment, the data processing system 100 may include a host 102 engaged or coupled with a memory system, such as memory system 110. For example, the host 102 and the memory system 110 can be coupled to each other via a data bus, a host cable, and the like to perform data communication.

The memory system 110 may include the memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements that are functionally divided. Further, according to an embodiment, the memory device 150 and the controller 130 may be implemented in a single chip or in a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

In FIG. 2, the memory device 150 may include one or more memory blocks 152, 154, 156. The memory block 152, 154, 156 may be understood as a group of non-volatile memory cells in which data is removed together by a single erase operation. The memory block 152, 154, 156 may include at least one page, e.g., a group of non-volatile memory cells that store data together during a single program operation and/or that output data together during a single read operation. For example, one memory block may include a plurality of pages.

In an embodiment, the memory device 150 may include a plurality of memory planes or one or more memory dies. According to an embodiment, the memory plane may be considered a logical or a physical partition including at least one memory block, a driving circuit capable of controlling an array of a plurality of non-volatile memory cells, and a buffer that can temporarily store data input to, or output from, non-volatile memory cells.

According to an embodiment, each memory die may include at least one memory plane and may be understood as a set of components implemented on a physically distinguishable substrate. Each memory die may be connected to the controller 130 through a data path, and may include an interface to exchange an item of data and a signal with the controller 130.

According to an embodiment, the memory device 150 may include at least one memory block 152, 154, 156, at least one memory plane, or at least one memory die. The internal configuration of the memory device 150 (e.g., shown in FIG. 1) may be different according to performance of the memory system 110. An embodiment of the present disclosure is not limited to the internal configuration shown in FIG. 2.

In FIG. 2, the memory device 150 includes the voltage supply circuit 170 which is capable of supplying one or more voltages to the memory block(s) 152, 154, 156. The voltage supply circuit 170 can include a voltage generation circuit for generating target voltages for the memory block(s) 152, 154, 156, for example, as described with reference to FIGS. 4 to 8.

In an embodiment, the voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell in the memory block(s) 152, 154, 156, the voltage supply circuit 170 may supply the read voltage Vrd to a selected non-volatile memory cell. During the program operation for storing data in the non-volatile memory cell in the memory block(s) 152, 154, 156, the voltage supply circuit 170 may supply the program voltage Vprog into a selected non-volatile memory cell. During a read operation or a program operation performed on the selected non-volatile memory cell, the voltage supply circuit 170 may supply a pass voltage Vpass to a non-selected non-volatile memory cell. During the erasing operation for erasing data stored in the non-volatile memory cell in the memory block(s) 152, 154, 156, the voltage supply circuit 170 may supply the erase voltage Vers to the memory block.

The memory device 150 may store information regarding various voltages which are supplied to the memory block(s) 152, 154, 156 based on which operation is performed. For example, when a non-volatile memory cell in the memory block(s) 152, 154, 156 can store multi-bit data, plural levels of the read voltage Vrd for recognizing or reading the multi-bit data item may be used. The memory device 150 may include a table with information indicating plural levels of the read voltage Vrd corresponding to the multi-bit data item. For example, the table can include bias values stored in a register, with each bias value corresponding to a specific level of the read voltage Vrd. The number of bias values for the read voltage Vrd that is used for a read operation may be limited to a preset range. Also, in an embodiment, the bias values can be quantized.

The host 102 may include a portable electronic device, e.g., a mobile phone, an MP3 player, a laptop computer, etc., or a non-portable electronic device, e.g., a desktop computer, a game player, a television, a projector, etc. According to an embodiment, the host 102 can include a central processing unit (CPU) included in the portable electronic device and the non-portable electronic device.

The host 102 may include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user request. The host 102 may transmit a plurality of commands corresponding to user requests to the memory system 110, thereby performing operations corresponding to the plurality of commands within the memory system 110.

The controller 130 may control the memory device 150 in response to a request or a command from the host 102. For example, the controller 130 may perform a read operation to provide data read from the memory device 150 to the host 102 and may perform a write operation, for example, a program operation, to store data input from the host 102 in the memory device 150. In order to perform data input/output (I/O) operations, the controller 130 may control and manage internal operations of reading data, programming data, erasing data, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components in the controller 130 as illustrated in FIG. 2 may vary according to structures, functions, operation performance, or the like, regarding the memory system 110.

For example, the memory system 110 may be implemented with any of various types of storage devices electrically coupled with the host 102 according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 may receive signals, commands (or requests), and/or data input from the host 102. For example, the host 102 and the memory system 110 may use a predetermined protocol to transmit and receive data therebetween. Examples of communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces used by Integrated Drive Electronics (IDE) devices. The 40 wires in the IDE interface can be reduced to six wires in the SATA interface. For example, parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide high transmission speed compared with other interfaces such as IDE and SATA. In the SCSI, the host 102 and at least one peripheral device, e.g., memory system 110, are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In SAS, the host 102 and a plurality of peripheral devices are connected in series, and data transmission and reception between the host 102 and each peripheral device may be performed in a serial data communication scheme. Also, SAS can support connection between the host 102 and the peripheral device through a serial cable instead of a parallel cable, to easily manage equipment using the SAS and enhance or improve operational reliability and communication performance. Also, SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting a computing device, e.g., host 102, and a peripheral device, e.g., memory system 110. For example, PCIe can use a plurality of pins, e.g., 18 pins, 32 pins, 49 pins, or 82 pins, and at least one wire, e.g., x1, x4, x8, or x16, to achieve high speed data communication over several hundred MB per second, e.g., 250 MB/s, 500 MB/s, 984.6250 MB/s, or 1969 MB/s. According to an embodiment, a PCIe scheme may achieve bandwidths of tens to hundreds of Giga bits per second. NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, e.g., a keyboard, a mouse, a joystick, a printer, a scanner, a storage device, a modem, a video camera, and the like. A plurality of peripheral devices such as the memory system 110 may be coupled to a single transceiver included in the host 102.

The error correction circuitry 138 can correct error bits of data read from the memory device 150, and may include an error correction code (ECC) encoder and an ECC decoder. The ECC encoder may perform error correction encoding of data to be programmed in the memory device 150 in order to generate encoded data into which a parity bit is added. The encoded data may be stored in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not and outputs an instruction signal, e.g., a correction success signal or a correction fail signal, based on a result of the error correction decoding. The error correction circuitry 138 may use a parity bit generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. In an embodiment, the error correction circuitry 138 can include at least some of the components in the controller 130 shown in FIG. 1.

The ECC decoder may perform hard decision decoding or soft decision decoding on data transmitted from the memory device 150. Hard decision decoding can be understood as one of two methods broadly classified for error correction. Hard decision decoding may include, for example, an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

Soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. A low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Hard decision decoding in which a value output from a non-volatile memory cell is coded as 0 or 1.

Compared to hard decision decoding, soft decision decoding can determine the value stored in the non-volatile memory cell based on the stochastic information. Regarding bit-flipping which may be considered an error that can occur in the memory device 150, soft decision decoding may provide improved probability of correcting the error and recovering data, as well as providing reliability and stability of corrected data. The LDPC-GM code may have a scheme in which internal low-density generator matrix (LDGM) codes can be concatenated in series with high-speed LDPC codes.

According to an embodiment, the ECC decoder may use, for example, low-density parity-check convolutional codes (LDPC-CCs) for the soft decision decoding. The LDPC-CCs may correspond to a scheme using a linear time encoding and a pipeline decoding based on a variable block length and a shift register.

According to an embodiment, the ECC decoder may use, for example, a Log Likelihood Ratio Turbo Code (LLR-TC) for soft decision decoding. A Log Likelihood Ratio (LLR) may be calculated as a non-linear function for a distance between a sampled value and an ideal value. In addition, a Turbo Code (TC) may include a simple code, for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but may also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. When the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path, e.g., a channel, a way, etc., that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102.

In addition, the controller 130 may temporarily store write data input from the host 102 in the memory 144 before programming the write data in the memory device 150. When the controller 130 controls operations such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information, e.g., map data, read requests, program requests, etc., used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates that the memory 144 disposed within the controller 130, embodiments are not limited thereto. The memory 144 may be located within or external to the controller 130. For instance, the memory 144 may be embodied by an external volatile memory having a memory interface for transferring data and/or signals between the memory 144 and the controller 130.

The processor 134 may control overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. The firmware may be, for example, a flash translation layer (FTL). According to an embodiment, the processor 134 may be implemented with a microprocessor, a central processing unit (CPU), or another processing device.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed or performance of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed without a command transmitted from the host 102, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102, e.g., manual GC, the garbage collection can be considered a foreground operation. When the memory system 110 performs garbage collection independently of the host 102, e.g., auto GC, the garbage collection can be considered a background operation.

When the memory device 150 includes a plurality of dies or a plurality of chips, each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels or ways associated with the plurality of dies included in the memory device 150. The controller 130 may determine a status of each channel or each way as one of a busy status, a ready status, an active status, an idle status, a normal status, and an abnormal status. The determination of which channel or way an instruction and/or a data is delivered through by the controller 130 can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel (s) or way(s) is used to exchange an instruction or data.

As above described, the memory device 150 in the memory system 110 may include one or more memory blocks 152, 154, 156. Each of the memory blocks 152, 154, 156 includes a plurality of non-volatile memory cells. According to an embodiment, the memory blocks 152, 154, 156 can be a group of non-volatile memory cells erased together. The memory blocks 152, 154, 156 may include a plurality of pages which is a group of non-volatile memory cells read or programmed together.

In an embodiment, each of the memory blocks 152, 154, 156 may have a three-dimensional stack structure for high integration. Further, the memory device 150 may include a plurality of dies, each die including a plurality of planes, each plane including the memory blocks 152, 154, 156. A configuration of the memory device 150 may be changed depending on performance of the memory system 110.

In FIG. 2, the memory device 150 includes memory blocks 152, 154, and 156 which may be any of single-level cell (SLC) memory blocks, multi-level cell (MLC) memory blocks, or the like, based on the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, with each memory cell storing multi-bit data, e.g., two or more bits of data. The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. A DLC memory block may include a plurality of pages implemented by memory cells, with each memory cell capable of storing 2-bit data. A TLC memory block can include a plurality of pages implemented by memory cells, with each memory cell capable of storing 3-bit data. A QLC memory block can include a plurality of pages implemented by memory cells, with each memory cell capable of storing 4-bit data. In another embodiment, the memory device 150 can be implemented with a block including a plurality of pages implemented by memory cells, with each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as an SLC buffer to temporarily store data because the buffer may require a high data input/output speed for improving performance of the memory system 110.

According to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Figure 3A:
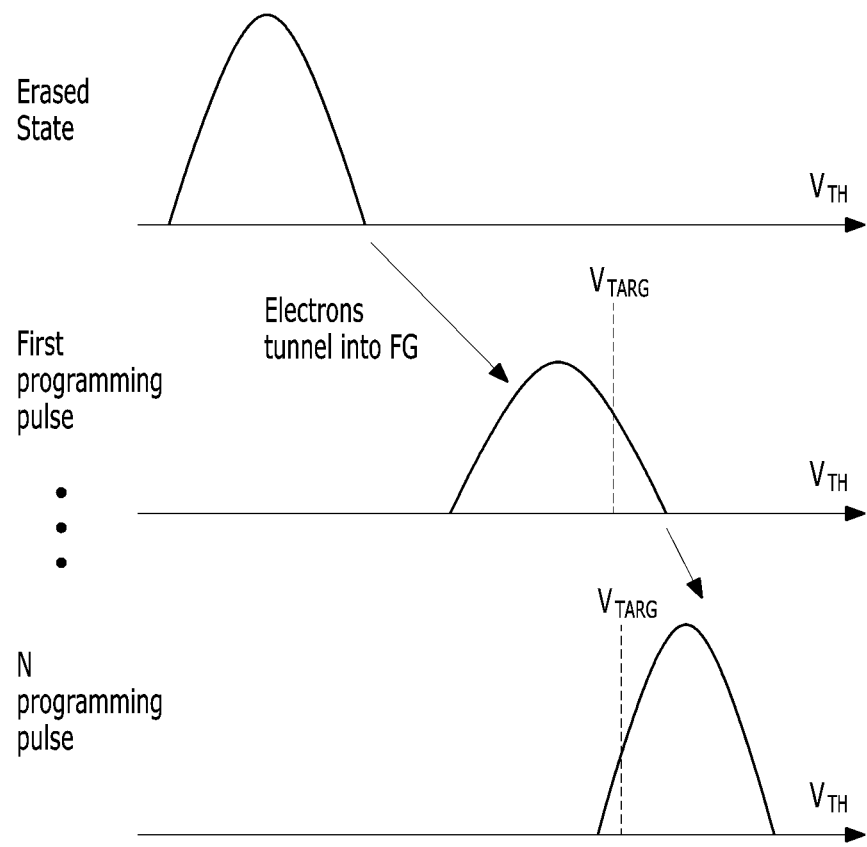
FIGS. 3A and 3B illustrate an Incremental Step Pulse Programming (ISPP) operation according to an embodiment of the present disclosure.
Figure 3B:
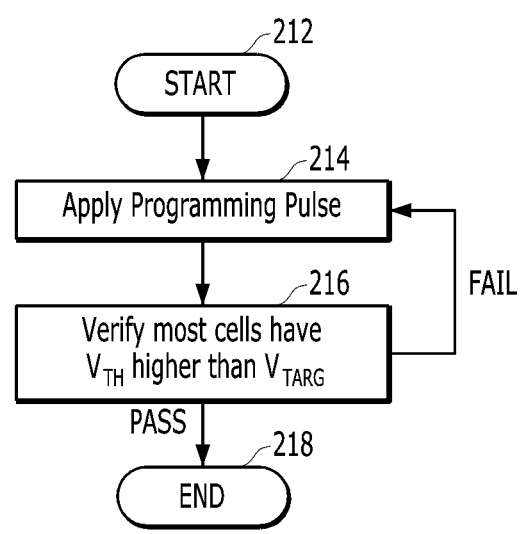

FIGS. 3A and 3B illustrate an Incremental Step Pulse Programming (ISPP) operation according to an embodiment of the present disclosure.

Referring to FIG. 3A, data may be programmed in a non-volatile memory cell that is in an erased state. When a programming pulse is supplied to a word line coupled to the non-volatile memory cell, the threshold voltage distribution of the non-volatile memory cell may shift from the erased state to the right, e.g., a direction in which the threshold voltage increases. If the programming pulse is continuously supplied to the non-volatile memory cell, the threshold voltage distribution of the non-volatile memory cell may continuously shift to the right. The programming pulse may be supplied until most of the plurality of non-volatile memory cells have a threshold voltage higher than the target voltage $V_{TARG}$ in a threshold voltage distribution.

In FIG. 3B, when a program operation starts (operation 212), the memory device 150 can apply a programming pulse to a plurality of non-volatile memory cells to be programmed with data (operation 214). After a programming pulse is applied, the memory device 150 can verify whether most of the plurality of non-volatile memory cells have a threshold voltage $V_{TH}$ higher than the target voltage $V_{TARG}$ (operation 216). When it is determined that most of the plurality of non-volatile memory cells do not have a threshold voltage $V_{TH}$ higher than the target voltage $V_{TARG}$ according to a verification result FAIL, the memory device 150 applies another programming pulse to the corresponding non-volatile memory cells (operation 214). When most of the plurality of non-volatile memory cells have a threshold voltage $V_{TH}$ higher than the target voltage $V_{TARG}$ according to another verification result PASS, the memory device 150 may end the program operation (operation 218).

In order to narrow the threshold voltage distribution of the plurality of non-volatile memory cells, it is advantageous to slightly shift, e.g., by a first amount, the threshold voltage distribution of the plurality of non-volatile memory cells to the right rather than greatly shifting them, e.g., by a second amount greater than the first amount, to the right when a single programming pulse is applied. On the other hand, when the threshold voltage distribution of the plurality of non-volatile memory cells is slightly shifted to the right, the number of times the programming pulse is applied may increase.

According to an embodiment, the number of times the programming pulse is applied may be three times or more than the number of bits of data may be stored in the non-volatile memory cell. For example, when 2 bits of data can be stored in a non-volatile memory cell, the non-volatile memory cell may have four programmed states (e.g., '00', '01', '10', and 11') corresponding to 2-bit data. In order to form a tighter threshold voltage distribution, e.g., a narrower distribution, a degree to which the threshold voltage distribution of a plurality of non-volatile memory cells is shifted to the right, in response to a single programming pulse, can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

According to an embodiment, the degree to which the threshold voltage distribution of the plurality of non-volatile memory cells moves when a single programming pulse is applied may be understood as a target level. An example of the target level is described in greater detail for the embodiment of FIG. 6.

Figure 4:
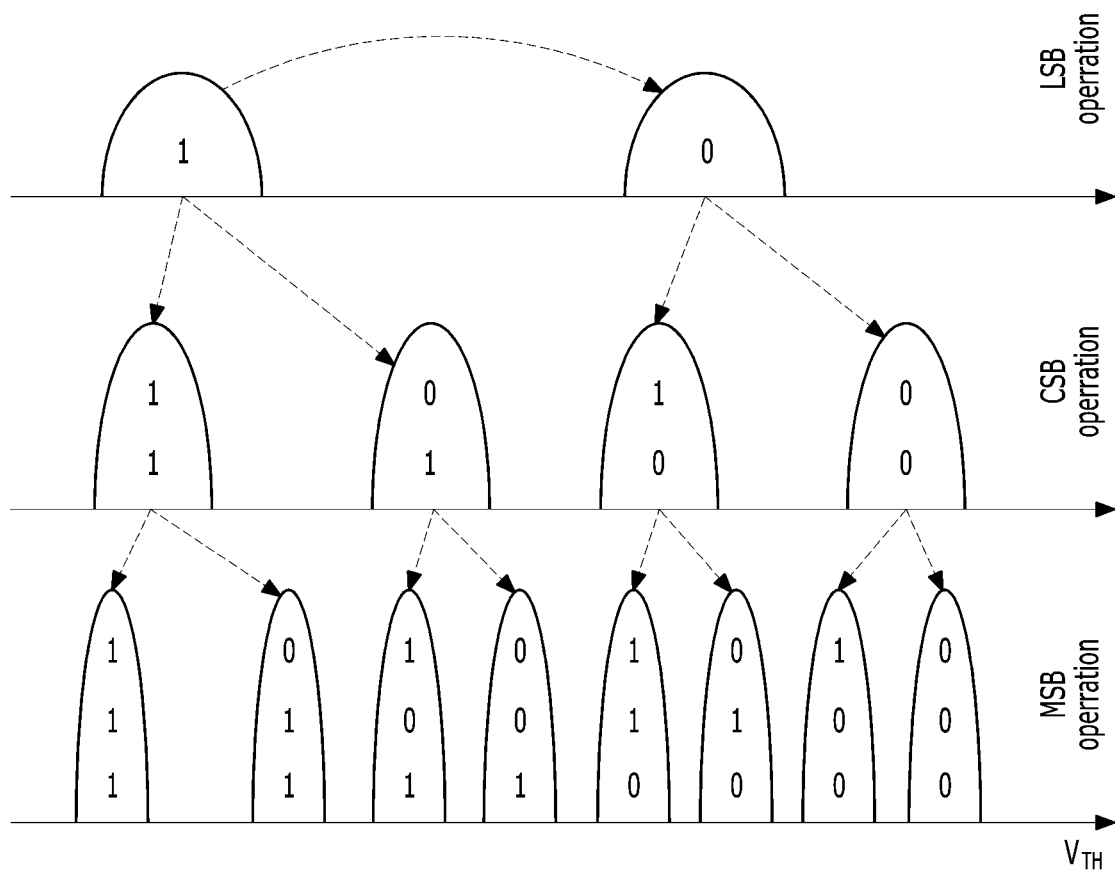
FIG. 4 illustrates a method for storing multi-bit data in a non-volatile memory cell according to an embodiment of the present disclosure.

FIG. 4 illustrates a method for storing multi-bit data in a non-volatile memory cell according to an embodiment of the present disclosure. The method of FIG. 4 may include a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on a quantity of electrons or charges injected into a floating gate of the corresponding memory cell. A single-level cell SLC may be divided into two ranges of the threshold voltage $V_{TH}$, to store 1-bit data of "0" or "1". On the other hand, a triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. For example, shifts of different positive threshold voltage ($V_{TH}$) distributions may be induced in processes of programming the LSB, CSB, and MSB data. In an embodiment, the threshold voltages $V_{TH}$ of the plurality of non-volatile memory cells can move the most in the process of programming the LSB page, and the threshold voltages $V_{TH}$ of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
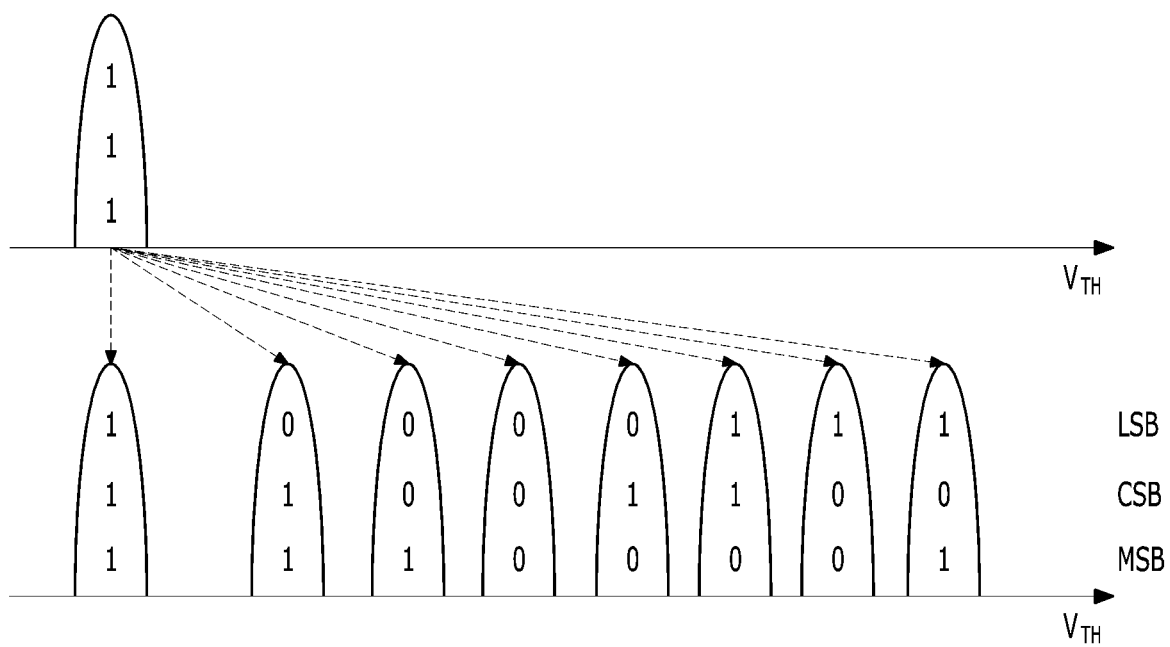
FIG. 5 illustrates another method for storing multi-bit data in a non-volatile memory cell according to an embodiment of the present disclosure.

FIG. 5 illustrates another method for storing multi-bit data in a non-volatile memory cell according to an embodiment of the present disclosure. In FIG. 5, a program operation performed by the memory device 150 including a non-volatile memory cell capable of storing 3-bit data will be described as an example.

Referring to FIG. 5, the memory device 150 may not sequentially divide the operation of storing 3-bit data in the non-volatile memory cell into LSB, CSB, and MSB program operations. In order to store the 3-bit data in the non-volatile memory cell without separation, code values for LSB, CSB, and MSB corresponding to eight program states can be different from those shown in FIG. 4. The 3-bit data corresponding to 8 program states can be determined as gray codes, and the code values for LSB, CSB, and MSB can be differently set. Herein, the gray code is a code made to change the value of only one bit (1 bit) between adjacent data when data is changed. For example, it may be understood that data in the erase state is '111', and data in the lowest program state is '011'. Data of the second lowest program state adjacent to data '011' of the lowest program state may be '001'.

Referring to FIGS. 4 and 5, code values of LSB, CSB, and MSB may be different according to how to store multi-bit data in a non-volatile memory cell. For example, the code value corresponding to the MSB of eight program states shown in FIG. 4 may be '10101010', while the code value of the MSB of eight program states shown in FIG. 5 may be '11100001'. According to an embodiment, the code values for the LSB and the MSB described in FIGS. 4 and 5 can be different according to an embodiment.

Figure 6:
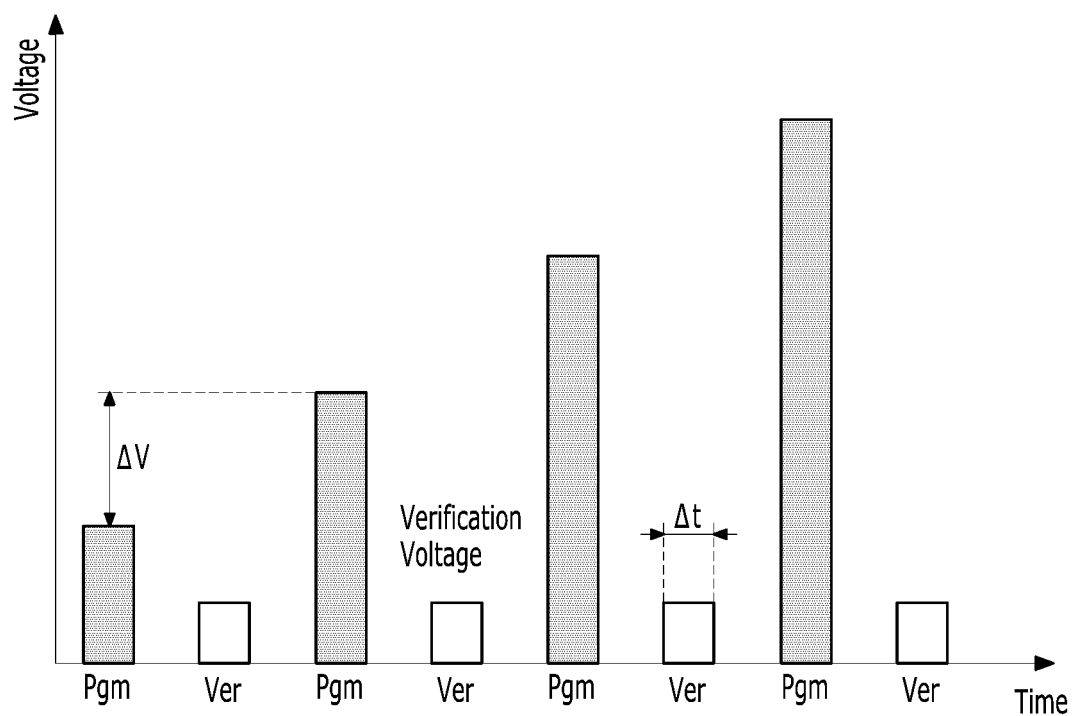
FIG. 6 illustrates a program operation and a verification operation of the Incremental Step Pulse Programming (ISPP) operation according to an embodiment of the present disclosure.

FIG. 6 illustrates a program voltage application operation and a verification operation of the ISPP operation according to an embodiment of the present disclosure.

Referring to FIG. 6, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell. For example, each program voltage application operation Pgm increases the threshold voltage $V_{TH}$ of the non-volatile memory cell by the first potential difference ΔV.

After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into a floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell becomes a verification voltage or higher.

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times Δt of the program voltage application operation Pgm and the verify operation Ver may vary according to a goal of each program voltage application operation Pgm, e.g., a change of the threshold voltage $V_{TH}$.

Referring to FIGS. 4 and 5, in a memory device including a triple-level non-volatile memory cell TLC, the program voltage application operation Pgm and the verify operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more bit data.

According to an embodiment, for each program loop during the ISPP operation, a voltage level of the program pulse applied to the non-volatile memory cell in the program voltage application operation Pgm may be gradually increased by a preset voltage ΔV. However, a voltage level of the verification pulse applied to the non-volatile memory cell in the verification operation Ver corresponding to the program voltage application operation Pgm may be substantially the same, e.g., not changed. In the verification operation Ver for each program loop, substantially the same verification pulse is applied to the non-volatile memory cell, but the time Δt for applying the verification pulse may vary. When the verification operation is performed by reflecting a noise generated according to operating characteristics of the memory device 150, the memory device 150 may change or adjust a voltage level of the verification pulse.

Figure 7:
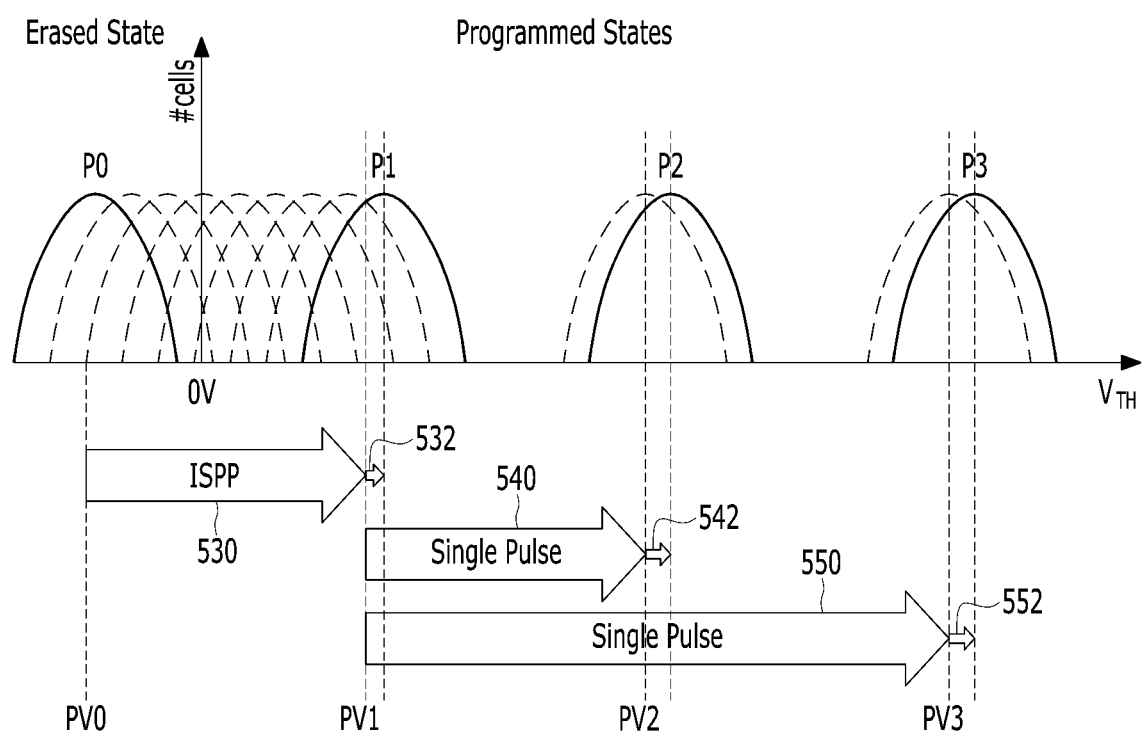
FIG. 7 illustrates a program operation according to an embodiment of the present disclosure.

FIG. 7 illustrates a program operation according to an embodiment of the present disclosure. In FIG. 7, an embodiment in which 2-bit data is stored in a non-volatile memory cell is described as an example. A threshold voltage level of the non-volatile memory cell capable of storing 2-bit data can belong to distributions corresponding to an erased state (P0) and first to third program states (P1 to P3).

Referring to FIG. 7, a program operation for storing multi-bit data in a non-volatile memory cell can roughly include two partial program operations. First, the memory device 150 can perform an ISPP operation to move a threshold voltage of the non-volatile memory cell from an erase state P0 to a first program state P1 (operation 530). Then, when it is determined that the non-volatile memory cell has a threshold voltage corresponding to the first program state P1 through the ISPP operation, the memory device 150 can perform a single program pulse operation to shift or increase the threshold voltage of the non-volatile memory cell from the first program state P1 to the second program state P2 or the third program state P3 (operations 540, 550). In the single program pulse operation, a single program pulse applied to the non-volatile memory cell can be determined based on a difference between the first program state P1 and the second program state P2 or the third program state P3 (see FIG. 8).

The 2-bit data programmed in the non-volatile memory cell can be divided into four data states of '11,' '10,' '00,' and '01'. According to an embodiment, the 2-bit data of '11' can correspond to an erase state P0. The 2-bit data of '10' can correspond to the first program state P1, the 2-bit data of '00' can correspond to the second program state P2, and the 2-bit data of '01' can correspond to the third program state P3. Among a plurality of non-volatile memory cells, a non-volatile memory cell in which the 2-bit data of '11' is to be stored can be maintained in the erased state P0. Even if at least one program pulse is applied to the non-volatile memory cell, the memory device 150 can adjust a potential of a bit line coupled to the non-volatile memory cell to suppress an increase in the threshold voltage of the non-volatile memory cell, i.e., the non-volatile memory cell is not programmed. Moreover, among the plurality of nonvolatile memory cells, the memory device 150 can apply a program pulse to the non-volatile memory cells in which the 2-bit data of '10,' '00,' or '01' are to be stored are changed from the erase state P0 to one of the first program state P1 to the third program state P3.

The memory device 150 may perform an ISPP operation on a non-volatile memory cell that is programmed to have a threshold voltage corresponding to one of the first program state P1 to the third program state P3 (operation 530). Referring to FIG. 6, in the ISPP operation 530, program pulses having a gradually increasing level may be applied to the non-volatile memory cell. The threshold voltage of the non-volatile memory cell may gradually shift from the erase state P0 to the first program state P1 in response to the program pulses that are applied.

In the operations 540, 550, a program pulse can be applied to at least some of the non-volatile memory cells in the first program state P1, so that the at least some of the non-volatile memory cells have a threshold voltage level corresponding to the second program state P2 or the third program state P3. In these operations, the memory device 150 can apply a single program pulse to non-volatile memory cells to increase threshold voltages of the non-volatile memory cells without performing the ISPP operation of applying plural program pulses for gradually increment. A first single program pulse applied to a non-volatile memory cell to be programmed into the second program state P2 can be determined based on a difference between the first program state P1 and the second program state P2 (operation 540). Further, a second signal program pulse corresponding to a difference between the first program state P1 and the third program state P3 can be applied to a non-volatile memory cell to be programmed into the third program state P3 (operation 550).

In the operations 540, 550 described above, because the memory device 150 applies a single program pulse to the non-volatile memory cell, the memory device 150 might not perform verification operations to check a threshold voltage in a process of changing from the first program state P1 to the second program state P2 or the third program state P3.

When a threshold voltage is gradually increased through the ISPP operation, the memory device 150 can perform a verification operation between applying program pulses to the non-volatile memory cell. However, during the ISPP operation, the threshold voltage is gradually increased so that most verification operations for the non-volatile memory cell might output a failure signal before the non-volatile memory cell has a threshold voltage corresponding to the second program state P2 or the third program state P3. That is, a result of comparing the threshold voltage of the non-volatile memory cell with a third verification target level PV3 corresponding to the third program state P3 fails until the non-volatile memory cell is programmed into the third program state P3. In this procedure, there is no difference between verification results output from a current sensing circuit (CSC) when a threshold voltage of the non-volatile memory cell is in the erased state P0 and when a threshold voltage of the non-volatile memory cell is in the second program state P2. Further, there is no significant difference of current consumption in the current sensing circuit CSC. When the current sensing circuit CSC outputs a failure signal several times in plural program loops, internal current consumption could increase. If internal current consumption (ICC) increases sharply, an adverse effect might occur on peak current consumption in the memory device 150.

According to an embodiment, a first verification target level PV1 corresponding to the first program state P1, a second verification target level PV2 corresponding to the second program state P2, and a third verification target level PV3 corresponding to the third program state P3 can be slightly lower than mean values of distributions corresponding to the first to third program states P1 to P3. Referring to FIG. 6, the first to third verification target levels PV1 to PV3 could be determined based on a level or an applied time of verification voltages. The verification voltages may have substantially the same level, but have different applied times, i.e., different times of applying the verification voltage to the non-volatile memory cells.

According to an embodiment, while threshold voltages of non-volatile memory cells are changed from the first program state P1 to the second program state P2 or the third program state P3, deviations in threshold voltage distributions of the non-volatile memory cells can increase, e.g., widths of the threshold voltage distributions become wider. Thus, when the non-volatile memory cells pass verification operations for the first to third verification target levels PV1 to PV3, the memory device 150 can additionally perform the ISPP operation (operations 532, 542, 552) to the non-volatile memory cells. Through the additional ISPP operations 532, 542, 552, the threshold voltage distributions of the plural non-volatile memory cells can be slightly shifted to the first to third program states P1 to P3 and the deviations in the threshold voltage distributions could decrease, that is, the widths of the distributions become narrower.

Figure 8:
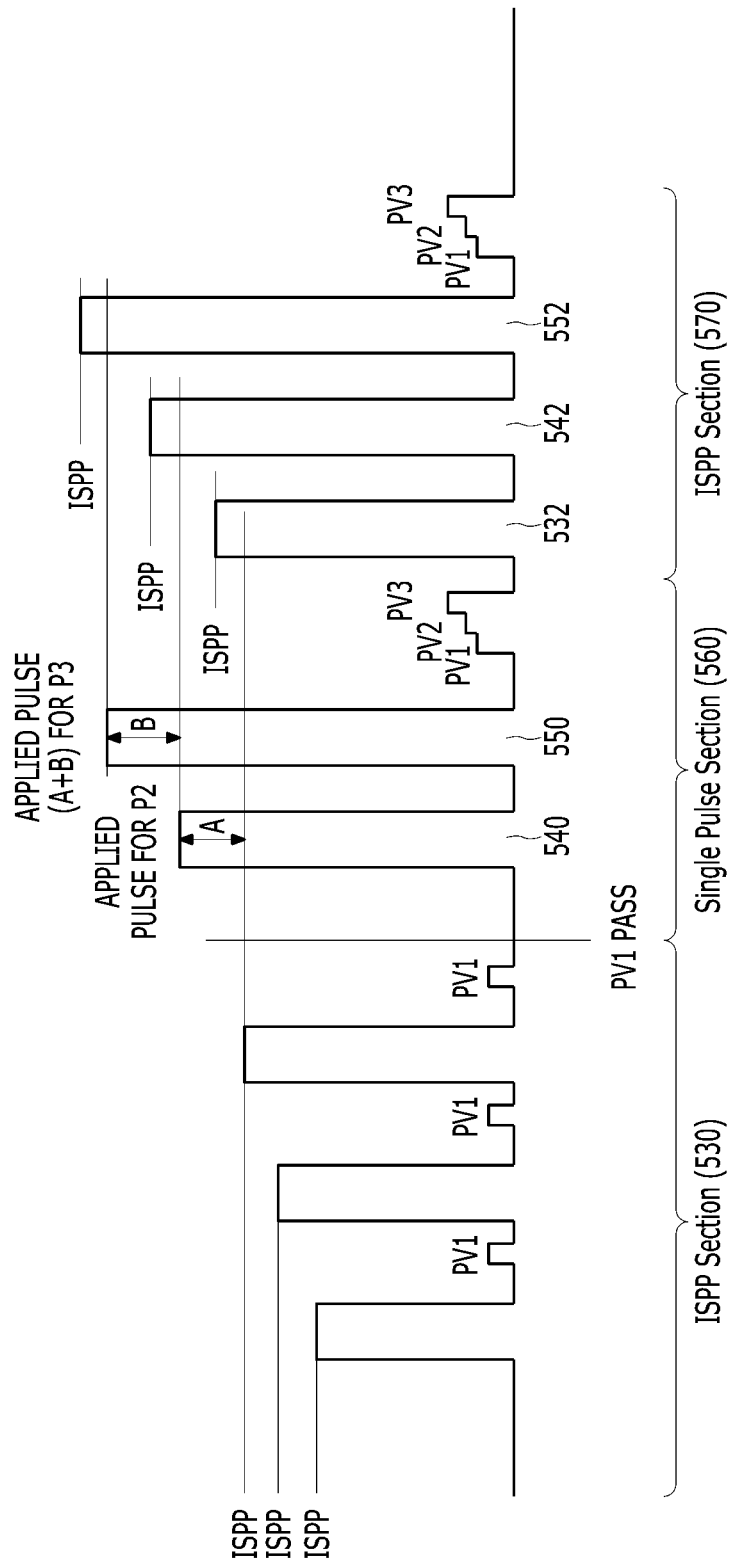
FIG. 8 illustrates a program pulse used in the program operation described with reference to FIG. 7 according to an embodiment of the present disclosure.

FIG. 8 illustrates a program pulse used in the program operation described with reference to FIG. 7 according to an embodiment of the present disclosure.

Referring to FIG. 8, a procedure of programming multi-bit data in plural non-volatile memory cells can include a first ISPP operation section 530, an operation section 560 for applying a single program pulse, and a second ISPP operation section 570.

Referring to FIGS. 7 and 8, threshold voltages of the non-volatile memory cells may shift from the erase state P0 to the first program state P1 during the first ISPP operation section 530. A verification operation for the first verification target level PV1 can be performed on the non-volatile memory cells which would be scheduled to be programmed with the first to third program states P1 to P3. Through a verification result, the memory device 150 can determine whether a right side of the threshold voltage distribution regarding the non-volatile memory cells reaches the first verification target level PV1. When the threshold voltage distribution reaches the first verification target level PV1 (PV1 PASS), the memory device 150 can terminate the first ISPP operation section 530. The right side of the threshold voltage distribution can include an upper tail (right tail) of normal distribution or probability distribution regarding threshold voltages of non-volatile memory cells. The upper tail means the appendage on the right side of a distribution (e.g., 3%, 5%, or 10% of the right side).

In the operation section 560 in which the single program pulse is applied after the first ISPP operation section 530, the memory device 150 might not perform plural loops of program pulse applications and verifications corresponding to the program pulse applications. The memory device 150 can apply the single program pulse to each of the non-volatile memory cells to shift or move threshold voltages from the first program state P1 to the second program state P2 or the third program state P3. A first program pulse corresponding to a difference between the first program state P1 and the second program state P2 can be applied to a first non-volatile memory cell to be programmed with the second program state P2 (operation 540). For example, the difference between the first program state P1 and the second program state P2 can indicate a difference between mean levels of threshold voltage distributions corresponding to the first program state P1 and the second program state P2. At this time, the first program pulse could be higher by a preset level (A) than the last program pulse applied in the first ISPP operation section 530. The preset level (A) can be determined based on the difference between the first program state P1 and the second program state P2. In addition, the memory device 150 can apply a second program pulse to a second non-volatile memory cell to be programmed with the third program state P3. The second program pulse can be higher by another preset level (A+B) than the last program pulse applied in the first ISPP operation section 530 (operation 550). The second program pulse can be determined based on differences (A+B) between the first program state P1 and the second program state P2 and between the second program state P2 and the third program state P3. After the first and second program pulses are applied to increase threshold voltages to the second program state P2 and the third program state P3 (operations 540, 550), the memory device 150 can perform verification operations for the first to third verification target levels PV1 to PV3 corresponding to the first to third program states P1 to P3 continuously.

When the memory device 150 determines that right sides of threshold voltage distributions of non-volatile memory cells have reached the first to third verification target levels PV1 to PV3 through the verification operation for (PASS), the memory device 150 can perform a second ISPP operation (section 570). The program pulse applied to a non-volatile memory cell during the second ISPP operation section 570 has a higher level than the program pulse applied to the non-volatile memory cell during the first ISPP operation section 530 or a program pulse applied to the non-volatile memory cell during the operation section 560. In the first ISPP operation section 530, program pulses having the same level can be applied to the plural non-volatile memory cells before each verification operation (see "PV1" in the ISPP section 530).

However, in the second ISPP operation section 570, program pulses having different levels can be applied to the plural non-volatile memory cells based on the first to third verification target levels PV1 to PV3 of the plural non-volatile memory cells before the verification operations (see PV1, PV2, PV3 in the ISPP section 570). For example, in the first ISPP operation section 530, a single program pulse can be applied to a word line connected to the plural non-volatile memory cells before each verification operation for the first verification target level PV1. On the other hand, in the second ISPP operation section 570, plural program pulses 532, 542, 552 having different levels can be sequentially applied to the word line connected to the plural non-volatile memory cells before the series of verification operations for the first to third verification target levels PV1 to PV3. The memory device 150 can adjust or change potentials of bit lines coupled to the non-volatile memory cells to selectively program the plural non-volatile memory cells coupled to the word line in response to the plural program pulses 532, 542, 552. After the plural program pulses 532, 542, 552 having different levels are sequentially applied to the word line connected to the plural non-volatile memory cells, the memory device 150 can perform verification operations for determining whether the plural non-volatile memory cells have the first to third program states P1 to P3 based on the first to third verification target levels PV1 to PV3 corresponding to the first to third program states P1 to P3.

Figure 9:
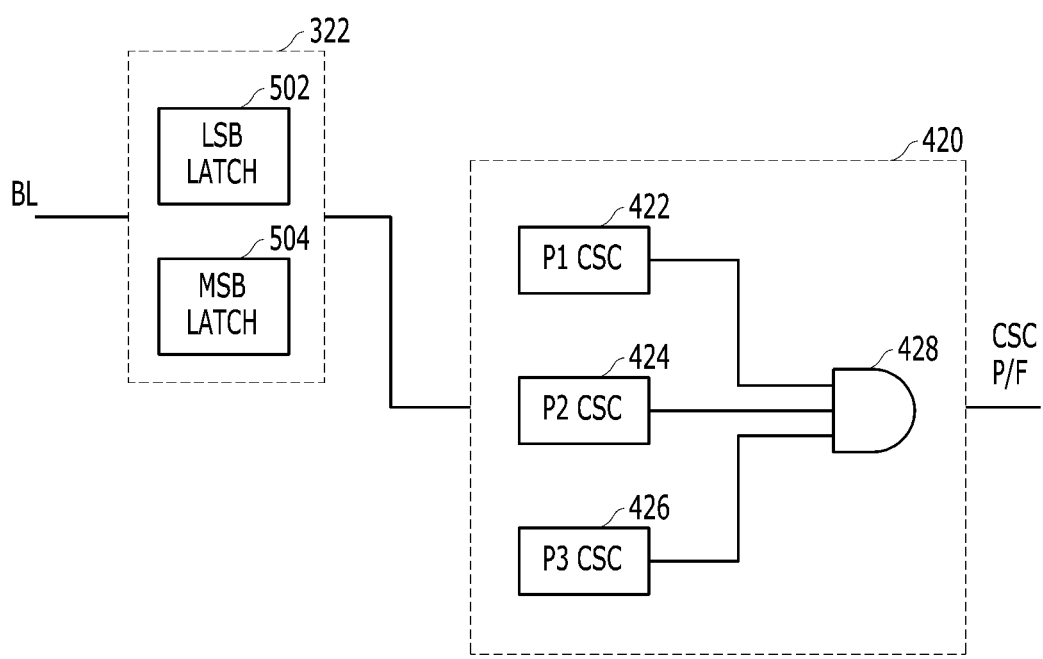
FIG. 9 illustrates an example of a current sensing circuit (CSC) for verifying a plurality of program values during the program operation described with reference to FIG. 7 according to an embodiment of the present disclosure.

FIG. 9 illustrates an example of a current sensing circuit (CSC) for verifying a plurality of program values during the program operation described with reference to FIG. 7 according to an embodiment of the present disclosure. Herein, the program value can indicate a target threshold voltage level subject to a program operation for which at least one program pulse is applied.

Referring to FIG. 9, the page buffer 322 in the memory device 150 can be coupled to the verification circuit 420. The page buffer 322 can be coupled to a non-volatile memory cell through a bit line BL. The page buffer 322 can include a plurality of latches 502, 504. When multi-bit data is stored in the non-volatile memory cell, the page buffer 322 can include the plurality of latches 502, 504, each latch capable of storing each bit data of the multi-bit data transferred through the bit line BL. For example, the page buffer 322 can include an LSB (least significant bit) latch 502 for storing LSB data and an MSB (most significant bit) latch 504 for storing MSB data.

The verification circuit 420 coupled to the page buffer 322 may include a plurality of current sensing circuits 422, 424, 426, each configured to perform a verification operation based on each of the first to third verification target levels PV1 to PV3. Referring to FIG. 8, the memory device 150 can continuously perform verification operations regarding the first to third verification target levels PV1 to PV3. When the verification circuit 420 includes the first to third current sensing circuits 422, 424, 426 corresponding to the first to third verification target levels PV1 to PV3 to perform the verification operations, the verification circuit 420 can include a logic AND gate 428 configured to sum results output from the first to third current sensing circuits 422, 424, 426 to output a verification result. The logic AND gate 428 can output the verification result CSC P/F as a pass signal when all of the first to third current sensing circuits 422, 424, 426 output a pass signal. On the other hand, if any of the first to third current sensing circuits 422, 424, 426 outputs a failure signal, the logic AND gate 428 can output the verification result CSC P/F as a failure signal.

According to an embodiment, the verification circuit 420 can include a single current sensing circuit, and sequentially perform plural verification operations based on the plurality of verification target levels PV1 to PV3 through the single current sensing circuit. After the results of the verification operations sequentially performed in the single current sensing circuit are temporarily stored in latches or registers, a result of the plural verification operations can be output. According to the results of the plural verification operations, a program operation can be additionally performed only when a result regarding verification target levels is a failure signal among the plural verification operations.

As described above, a memory system or a memory device according to an embodiment of the present disclosure can reduce an amount of current consumed during a program operation and stabilize or alleviate peak current consumption.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
a cell array comprising non-volatile memory cells, each non-volatile memory cell capable of storing multi-bit data corresponding to a plurality of program states and an erased state; and
a control circuit configured to perform at least two partial program operations for programming the multi-bit data to at least two non-volatile memory cells,
wherein the at least two partial program operations include:
an Incremental Step Pulse Programming (ISPP) operation to increase threshold voltages of the at least two non-volatile memory cells from the erased state to a first program state among the plurality of program states, and
a single pulse program operation to increase a threshold voltage of at least one non-volatile memory cell among the at least two non-volatile memory cells from the first program state to another program state which is higher than the first program state among the plural program states.

2. The memory device according to claim 1, wherein the control circuit is further configured to:
apply program pulses to the at least two non-volatile memory cells for the ISPP operation to gradually increase the threshold voltages from the erased state to the first program state which is the lowest threshold voltage level among the plurality of program states corresponding to the multi-bit data,
perform a first verification operation for determining whether the at least two non-volatile memory cells have a threshold voltage corresponding to the first program state,
apply a single first program pulse to a first non-volatile memory cell among the at least two non-volatile memory cells based on a result of the first verification operation to increase a threshold voltage of the first non-volatile memory cell to a second program state among the plurality of program states corresponding to the multi-bit data which is higher than the first program state, the first program pulse corresponding to a difference between the first program state and the second program state, and
apply a single second program pulse to a second non-volatile memory cell among the at least two non-volatile memory cells based on a result of the first verification operation to increase a threshold voltage of the second non-volatile memory cell to a third program state among the plurality of program states corresponding to the multi-bit data which is higher than the second program state, the second program pulse corresponding to a difference between the first program state and the third program state.

3. The memory device according to claim 2,
wherein the at least two non-volatile memory cells include non-volatile memory cells to be programmed to have threshold voltages corresponding to the first program state, the second program state, and the third program state, and
wherein the result of the first verification operation is determined based on whether a ratio of non-volatile memory cells having a threshold voltage corresponding to the first program state among the at least two non-volatile memory cells is equal to or greater than a reference.

4. The memory device according to claim 2, wherein the control circuit is further configured to perform a second verification operation for determining whether the at least two non-volatile memory cells have threshold voltages corresponding to the second program state and the third program state, respectively, after applying the first program pulse and the second program pulse, respectively.

5. The memory device according to claim 4, wherein the control circuit is further configured to apply program pulses to the first non-volatile memory cell to gradually increase the threshold voltage of the first non-volatile memory cell, when determining that the first non-volatile memory cell fails to have a threshold voltage corresponding to the second program state as a result of the second verification operation.

6. The memory device according to claim 4, wherein the control circuit is further configured to apply program pulses to the second non-volatile memory cell to gradually increase the threshold voltage of the second non-volatile memory cell, when determining that the second non-volatile memory cell fails to have a threshold voltage corresponding to the third program state as a result of the second verification operation.

7. The memory device according to claim 4,
wherein the second verification operation includes a verification operation for determining whether the at least two non-volatile memory cells have a threshold voltage corresponding to the first program state, and
wherein the control circuit is further configured to apply program pulses to some of the at least two non-volatile memory cells to gradually increase the threshold voltages to the first program state when determining that the some of the at least two non-volatile memory cells fail to have a threshold voltage corresponding to the first program state as a result of the verification operation.

8. The memory device according to claim 1, further comprising:

a page buffer configured to temporarily store the multi-bit data from one of the plural non-volatile memory cells, and including plural latches, a number of which is equal to or greater than a bit number of the multi-bit data; and a verification circuit coupled to the page buffer and configured to verify whether the multi-bit data is stored in each of the plural non-volatile memory cells.

9. The memory device according to claim 8, wherein the verification circuit comprises:

plural current sensing circuits configured to perform a verification operation for the first program state, the second program state, and the third program state, respectively, to output either a pass signal or a failure signal regarding each of the first program state, the second program state, and the third program state; and a first component configured to output program success when the plural current sensing circuits output the pass signal.

10. A method for operating a memory device, comprising:

receiving multi-bit data to be programmed in plural non-volatile memory cells;

applying program pulses to at least two non-volatile memory cells in an erased state among the plural non-volatile memory cells to gradually increase threshold voltages of the at least two non-volatile memory cells from the erased state to a first program state which is the lowest program state among a plurality of program states corresponding to the multi-bit data;

performing a first verification operation for determining whether the at least non-volatile memory cells have a threshold voltage corresponding to the first program state;

applying a single first program pulse to a first non-volatile memory cell among the at least two non-volatile memory cells based on a result of the first verification operation to increase a threshold voltage of the first non-volatile memory cell to a second program state among the plurality of program states corresponding to the multi-bit data which is higher than the first program state, the first program pulse corresponding to a difference between the first program state and the second program state; and applying a single second program pulse to a second non-volatile memory cell among the at least two non-volatile memory cells based on a result of the first verification operation to increase a threshold voltage of the second non-volatile memory cell to a third program state among the plurality of program states corresponding to the multi-bit data which is higher than the second program state, the second program pulse corresponding to a difference between the first program state and the third program state.

11. The method according to claim 10, wherein the at least two non-volatile memory cells include non-volatile memory cells to be programmed to have threshold voltages corresponding to the first program state, the second program state, and the third program state, and wherein the result of the first verification operation is determined based on whether a ratio of non-volatile memory cells having a threshold voltage corresponding to the first program state among the at least two non-volatile memory cells is equal to or greater than a reference.

12. The method according to claim 10, further comprising performing a second verification operation for the second program state and the third program state after applying the first program pulse and the second program pulse.

13. The method according to claim 12, further comprising applying program pulses to the first non-volatile memory cell to gradually increase the threshold voltage of the first non-volatile memory cell, when determining that the first non-volatile memory cell fails to have a threshold voltage corresponding to the second program state based on a result of the second verification operation.

14. The method according to claim 12, further comprising applying program pulses to the second non-volatile memory cell to gradually increase the threshold voltage of the second non-volatile memory cell, when determining that the second non-volatile memory cell fails to have a threshold voltage corresponding to the third program state based on a result of the second verification operation.

15. The method according to claim 12, further comprising:

performing a verification operation for the first program state during the second verification operation; and applying program pulses to some of the at least two non-volatile memory cells to gradually increase the threshold voltages of the some of the at least two non-volatile memory cells to the first program state when determining that the some of the at least two non-volatile memory cells fail to have a threshold voltage corresponding to the first program state as a result of the verification operation during the second verification operation.

16. A memory system, comprising:

a controller configured to receive data from an external device, determine a location in which the data is to be stored, and generate multi-bit data to be stored in the location; and a memory device configured to:

receive the multi-bit data according to the location from the controller, apply program pulses to at least two non-volatile memory cells in an erased state among a plurality of non-volatile memory cells to gradually increase threshold voltages of the at least two non-volatile memory cells from the erased state to a first program state which is the lowest program state among a plurality of program states corresponding to the multi-bit data, perform a first verification operation for determining whether the at least non-volatile memory cells have a threshold voltage corresponding to the first program state, apply a single first program pulse to a first non-volatile memory cell among the at least two non-volatile memory cells based on a result of the first verification operation to increase a threshold voltage of the first non-volatile memory cell to a second program state among the plurality of program states corresponding to the multi-bit data which is higher than the first program state, the first program pulse corresponding to a difference between the first program state and the second program state, and apply a single second program pulse to a second non-volatile memory cell among the at least two non-volatile memory cells based on a result of the first verification operation to increase a threshold voltage of the second non-volatile memory cell to a third program state among the plurality of program states corresponding to the multi-bit data which is higher than the second program state, the second program pulse corresponding to a difference between the first program state and the third program state.

17. The memory system according to claim 16, wherein the memory device is further configured to transmit a completion signal to the controller when a program operation regarding the multi-bit data is completed.

18. The memory system according to claim 16,
wherein the at least two non-volatile memory cells include non-volatile memory cells to be programmed to have threshold voltages corresponding to the first program state, the second program state, and the third program state, and
wherein the result of the first verification operation is determined based on whether a ratio of non-volatile memory cells having a threshold voltage corresponding to the first program state among the at least two non-volatile memory cells is equal to or greater than a reference.

19. The memory system according to claim 16, wherein the memory device is further configured to perform a second verification operation for the second program state and the third program state after applying the first program pulse and the second program pulse.

20. The memory system according to claim 19, wherein the memory device is further configured to:
apply program pulses to the first non-volatile memory cell to gradually increase the threshold voltage of the first non-volatile memory cell, when determining that the first non-volatile memory cell fails to have a threshold voltage corresponding to the second program state as a result of the second verification operation; and
apply program pulses to the second non-volatile memory cell to gradually increase the threshold voltage of the second non-volatile memory cell, when determining that the second non-volatile memory cell fails to have a threshold voltage corresponding to the third program state as the result of the second verification operation.

\* \* \* \* \*